United States Patent [19]

Dennard et al.

[11] 4,090,289

[45] May 23, 1978

[54] METHOD OF FABRICATION FOR FIELD EFFECT TRANSISTORS (FETS) HAVING A COMMON CHANNEL STOPPER AND FET CHANNEL DOPING WITH THE CHANNEL STOPPER DOPING SELF-ALIGNED TO THE DIELECTRIC ISOLATION BETWEEN FETS

[75] Inventors: Robert Heath Dennard, Croton-on-Hudson; Vincent Leo Rideout, Mohegan Lake, both of N.Y.

[73] Assignee: International Business Machines Corporation, Armonk, N.Y.

[21] Appl. No.: 715,466

[22] Filed: Aug. 18, 1976

[51] Int. Cl.² ............................................. B01J 17/00
[52] U.S. Cl. ..................................................... 29/571
[58] Field of Search ........................................ 29/571

[56] References Cited

U.S. PATENT DOCUMENTS

| 3,600,647 | 8/1971 | Gray | 29/571 |
| 3,789,504 | 2/1974 | Jaddam | 29/571 |

*Primary Examiner*—W. Tupman
*Attorney, Agent, or Firm*—John J. Goodwin

[57] ABSTRACT

A fabrication method for providing electrical isolation between transistors such as field effect transistors (FETs) which are fabricated on the same semiconductive substrate is described that uses a single doping step to form both the channel stopper field doping and the FET channel doping. An example of an n-channel FET embodiment is described wherein an extra p-type doping is provided in the field region which serves to prevent parasitic conductive channels from occurring under the thick field oxide. Such parasitic channels can undesirably cause electrical shorting between adjacent FETs of an integrated circuit. Extra p-type doping is also provided in the FET channel region and serves to raise the gate threshold voltage of the enhancement-mode FET to a level suitable for integrated circuit operation. In the described method a single implantation or diffusion doping step provides both the field and channel doping regions, thereby reducing the number of processing steps. This single doping step is facilitated by use of a thick field isolation oxide which is chemically vapor deposited at a relatively low processing temperature after performing the common doping step.

14 Claims, 13 Drawing Figures

METHOD OF FABRICATION FOR FIELD EFFECT TRANSISTORS (FETS) HAVING A COMMON CHANNEL STOPPER AND FET CHANNEL DOPING WITH THE CHANNEL STOPPER DOPING SELF-ALIGNED TO THE DIELECTRIC ISOLATION BETWEEN FETS

BACKGROUND OF THE INVENTION

1. Field of the Invention

The present invention relates generally to a method for providing dielectric insulation regions for electrical isolation between transistors of an integrated circuit or circuits on the same semiconductive substrate. More particularly the present invention relates to a method for providing, between n-channel field effect transistors (FETs) located on the same semiconductive substrate, dielectric isolation regions with an extra p-type parasitic channel stopper doping self-aligned with respect to the dielectric isolation. Furthermore, the present invention provides enhancement-mode (i.e., normally-off) FETs having a gate threshold voltage which is advantageously increased to a more positive value by the addition of a p-type dopant in the channel region of the substrate.

2. Description of the Prior Art

It is known in the prior art that integrated circuits containing many thousands of transistors on a single semiconductive substrate or chip may be fabricated. Such a semiconductor chip typically measures one quarter of one inch on a side, or less. A major concern in the fabrication of integrated circuits is the means by which the transistors on the substrate may be electrically isolated one from another wherever desired. More particularly, the doped source and/or drain regions of one FET must be prevented from electrically shorting to the source and/or drain regions of an adjacent FET.

Methods for electrically isolating adjacent FETs on the same substrate are known in the art. FETs may be formed by using the p-channel (PMOS) technology (i.e., n-type doped substrate), or by using the n-channel (NMOS) technology (i.e., p-type doped substrate). Of these, the p-channel technology is simpler to fabricate in part because the n-type dopant in the substrate tends to accumulate at the substrate surface near the interface with a thick, thermally-grown, field-isolation oxide, thereby naturally providing additional protection against parasitic conductive channels that might otherwise form beneath the field oxide. The n-channel technology, however, is preferred because of the inherently higher surface mobility which gives a shorter device switching time. Unfortunately, when an oxide layer is grown on a p-type substrate, the p-type dopant such as boron is disadvantageously depleted from the semiconductor surface by the growing oxide. The boron remains inert in the oxide. This well known boron depletion effect is described for example by Grove, Leistiko, and Sah in "Redistribution of Acceptor and Donor Impurities During Thermal Oxidation of Silicon", Journal of Applied Physics, vol. 35, number 4, pp. 2695–2701, Sept. 1964.

When boron depletion occurs, parasitic conductive channels may form beneath the thick field oxide due to the presence of an electric field caused by oxide charges or by interconnection lines with a positive potential. Thus, in order to stop parasitic channels from forming the p-type dopant lost from the semiconductive surface must be replenished from deeper in the substrate, or augmented by an additional doping step. In the former case the semiconductive substrate is relatively heavily doped p-type to begin with, typically 2 ohm-cm (i.e. $7.5 \times 10^{15}$ dopant atoms per $cm^3$). The field oxide is provided by thermally growing a thick silicon dioxide layer over the entire surface of the silicon substrate in the presence of steam at a relatively high processing temperature of about 1000° C. This causes considerable boron depletion in the silicon substrate near the silicon-silicon dioxide interface. Later in the fabrication process, device regions are opened in the thick oxide by lithographic delineation and by etching, the FET gate insulator is formed, the gate regions are defined, and the n-type source and drain regions are formed. Formation of the gate insulator and the source/drain regions involves high processing temperatures during which p-type doping impurities diffuse to the silicon surface from the relatively heavily doped silicon bulk. Thus the use of a relatively heavily doped p-type silicon substrate allows the depleted surface doping to be returned near enough to its original value that surface inversion can be prevented.

The use of a relatively highly doped substrate, however, offers several problems. One is that the depletion layer capacitance of n-type source and drain regions is relatively larger, being proportional to the square root of the substrate doping concentration. Another problem is that the highly doped substrate is somewhat incompatible with channel implantation and hence threshold adjustment of the enhancement-mode device is usually accomplished with substrate bias. Yet another problem is that the gate threshold voltage sensitivity to changes in the source-to-substrate bias (i.e., the FET substrate sensitivity) is detrimentally enhanced by the higher substrate doping.

In fabricating FET integrated circuits it is generally preferable to use a relatively lightly doped substrate of the order of 5 to 15 ohm-cm (i.e., 2.5 to $1.0 \times 10^{15} cm^{-3}$). This requires that additional p-type doping be provided to replace boron atoms depleted by a thermally grown field oxide, to augment the substrate doping in the field regions, and to prevent parasitic inversion layers from forming under the field oxide. An additional field doping is often referred to as a parasitic "channel stopper" region and may be formed by several known methods. One such approach has been described by R. J. Whittier in "Semiconductor Memories:, The Impact and Momentum of Current Technology", IEEE Electro 76 Meeting Tech. Digest, Session 33, FIG. 3B, p. 2, Boston, May 11, 1976. In this method an extra lithographic masking step is used to provide a p-type doped region that is not precisely registered with respect to the field oxide region. This technique requires a larger field oxide region due to the nonregistered nature of the channel stopper region, and an additional masking step which complicates the process.

A more recently developed isolation procedure, selective oxidation isolation, is shown in FIG. 3C of the abovementioned article by Whittier. In the selective oxidation technique, the masked regions used to selectively define the oxide isolation regions also are used to selectively block the p-type field doping from entering the device regions. Thus the field doping is self-aligned with respect to the field isolation regions and an extra lithographic masking step is not required. In addition, the self-alignment feature leads to smaller isolation regions. When the silicon surface is not etched prior to thermally growing the selective oxide, the oxide is partially recessed into the semiconductor surface. A processing sequence for the partially recessed oxide technique is described by Richman in "MOS Field-Effect Transistors and Integrated Circuits", Wiley-Interscience Pub., New York 1973, pp. 207-212. With silicon etching, the oxide may be grown fully recessed with respect to the silicon surface as described by Dennard, Rideout and Walker, "Method and Device for Reducing Sidewall Conduction in Recessed Oxide FET Arrays", U.S. Pat. No. 3,899,363, Aug. 12, 1975.

A difficulty with selective oxidation is that an oxidation barrier layer must be used to prevent oxidation in the device regions. Typically this oxidation barrier layer is of silicon nitride which is stable, inert, and simple to deposit. The mechanical properties of a silicon nitride layer are such, however that the underlying silicon surface tends to be strained and damaged. As a consequence, a padding layer of silicon dioxide is typically used under the silicon nitride oxidation barrier layer to reduce the strain. When the selective oxidation is performed, this oxide layer acts as a diffusion path for oxygen and detrimentally enhances the lateral oxidation thereby enlarging the selective isolation region as described by Bassous, Yu and Maniscalco, "The Formation of Bird's Beak in Silicon Structures with Recessed $SiO_2$", ECS Fall Meeting Digest of Extended Abstracts, Dallas, Oct. 5-10, 1975, pp. 457-458. A further problem is that the chemical etchants for silicon nitride such as phosphoric acid ($H_3PO_4$) can contaminate the silicon surface. Finally, a reaction with the nitride layer during thermal oxidation can lead to an unwanted nitride region being formed on the silicon surface near the growing oxide as described by Kooi, Van Lierop and Appels, "Formation of Silicon Nitride at an Si-SiO Interface During Local Oxidation of Silicon and During Heat Treatment of Oxidized Silicon in NH Gas", Paper 275 RNP, ECS Fall Meeting, Dallas, Oct. 9, 1975.

SUMMARY OF THE INVENTION

An object of the present invention is to provide an improved method for fabricating dielectric isolation regions for electrical isolation of n-channel FETs of an integrated circuit.

A further object of the invention is to provide a method for fabricating FET structures having a silicon dioxide isolation region that has additional p-type doping under the isolation region to prevent surface inversion and parasitic conduction channels from forming thereunder.

Another object of the invention is to provide a method for fabricating dielectric isolation regions in which the p-type parasitic channel stopper doping is self-aligned with respect to the oxide isolation regions and does not require additional masking steps to define the channel stopper regions.

Still another object of the invention is to provide a method for fabricating oxide isolation regions without the use of the oxidation barrier layers such as silicon nitride.

Still another object is to provide field oxide dielectric isolation regions under which leakage currents from source to drain of an isolated FET do not occur or only occur to a tolerable level.

Still another object of the present invention is to provide dielectric isolation regions for isolating FETs of an integrated circuit or circuits present on the same semiconductive substrate or chip, and to prevent or reduce to a tolerable level leakage currents between the source or drain of one FET and another semiconductor device or the source or drain of another like FET present on the same substrate.

Still another object of the present invention is to provide the channel stopper field doping and the FET channel doping in the same ion implantation or diffusion step.

The foregoing and other objects, features, and advantages of the invention will be apparent from the following more particular description of a preferred embodiment of the invention, as illustrated in the accompanying drawings.

DESCRIPTION OF THE PREFERRED EMBODIMENTS

Figure 1:
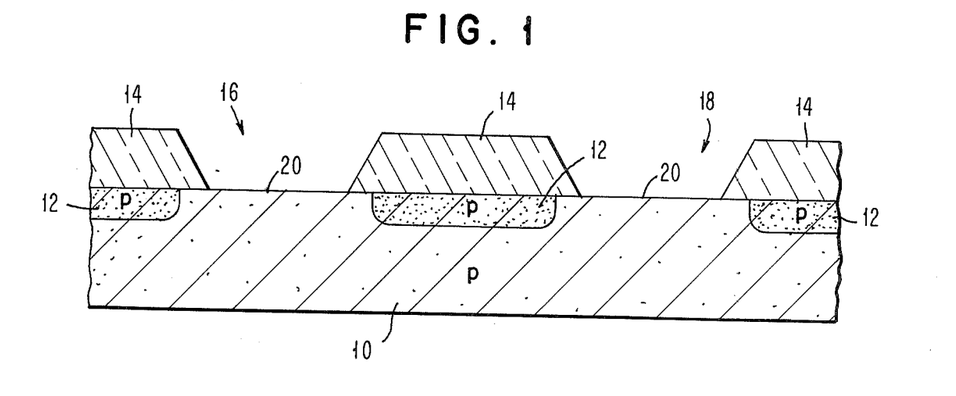
FIG. 1 shows a cross sectional view of a prior art oxide isolation structure with a nonself-aligned channel stopper region.

Referring to FIG. 1 there is shown a cross sectional view of the aforementioned oxide isolation structure 10 with a nonself-aligned channel stopper region 12 as described by Whittier. In the first lithographic delineation step of the process a p-type doped region 12 is fabricated. Then a thick oxide layer 14 is thermally grown over the entire wafer. In the second lithographic step of the process of the device regions 16 and 18 are opened by etching through the thick field oxide. The field oxide is not self-aligned with respect to the p-type doping and consequently additional area must be provided to account for the mask to mask misregistration that naturally occurs in lithographic exposure systems. It is noted that the oxide dielectric regions 14 are not recessed with respect to the semiconductive silicon surface 20.

Figure 2:
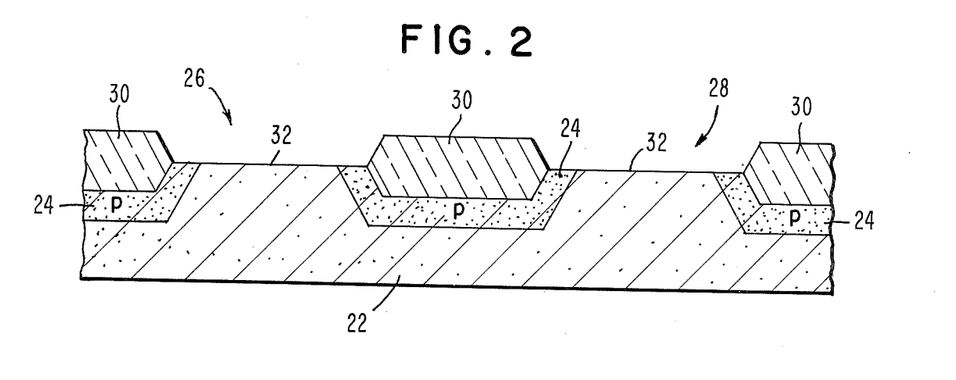
FIG. 2 shows a cross sectional view of a prior art partially recessed selective oxide isolation structure with a self-aligned channel stopper region.

FIG. 2 shows a cross sectional view of the aforementioned selective oxidation isolation structure 22 with a self-aligned channel stopper 24 as described by Whittier and by Richman. A single lithographic masking step has been employed to obtain the structure shown. This masking pattern serves both to delineate the oxidation barrier layer (not shown) and to block p-type dopant atoms from entering the device regions 26 and 28. The p-type channel stopper doping 24 is advantageously self-aligned with respect to the field oxide regions 30 which are partially recessed with respect to the semiconductive silicon surface 32. This method provides dielectric isolation regions 30 which are relatively smaller than those 14 of FIG. 1 due to the self-registering feature of the channel stopper, but has the unattractive aspect of requiring an oxidation barrier masking layer (not shown) such as silicon nitride which can strain and damage the silicon device regions 26 and 28. Removal of the oxidation barrier layer can also detrimentally contaminate the silicon surface in the device regions. Furthermore, a silicon dioxide padding layer (not shown) may be required between the oxidation barrier layer and the semiconductive silicon surface in the device regions. When employed, such an oxide padding layer enhances lateral oxidation and results in an enhanced bird's beak effect as described in the aforementioned paper by Bassous, Yu and Maniscalco.

As stated hereinabove, FIGS. 1 and 2 illustrate prior art oxide isolation techniques and FIGS. 3, 4A through 4E, and 6 show an embodiment of the present invention.

Figure 3:
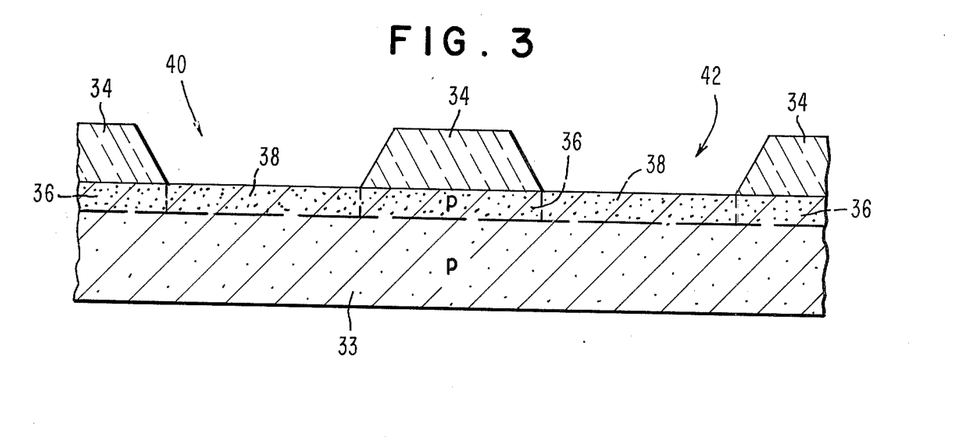
FIG. 3 shows a cross sectional view of the dielectric isolation structure made following the method of the present invention.

FIG. 3 illustrates a cross sectional view of a structure 33 with dielectric isolation regions 34 fabricated according to the method of the present invention. This structure has the advantageous feature of self-alignment between the field doping regions 36 and the dielectric isolation regions 34 as in the structure of FIG. 2, but advantageously does not use an oxidation barrier layer as required in the fabrication of the structure of FIG. 2. It is noted that unlike the dielectric isolation methods of FIGS. 1 and 2, however, the method of the present invention in FIG. 3 uses a chemically vapor deposited oxide 34 rather than a thermally grown oxide 14 and 30 to provide the thick dielectric isolation. A further distinction is that the p-type channel stopper field doping 36 under the dielectric isolation regions 34 and the p-type channel doping 38 in the device regions 40 and 42 are provided in the same ion implantation or diffusion step. if it is desired to provide a p-type channel doping for the structures of FIGS. 1 or 2, a separate doping step must be provided after revealing the device regions. In contrast, in the method of the present invention, the channel doping and the field doping are provided in the same doping step thereby simplifying the process. Another distinction of the present invention is that the channel and the field doping regions are formed prior to depositing the field oxide and prior to opening the device areas 40 and 42 by masking and etching the field oxide.

For convenience, the discussion of the fabrication steps of the present invention is directed to the preferred aspect of employing a p-type silicon substrate as the semiconductive substrate, p-type impurities as the diffused or implanted dopant impurities for the doped field and channel regions, and n-type impurities as the diffused or implanted dopant impurities for the doped source and drain regions. This leads to the n-channel (NMOS) FET technology. Accordingly, it is understood that an n-type substrate and p-type diffused or implanted dopant impurities can be employed according to the present invention in the p-channel (PMOS) FET technology.

It is understood that when the discussion refers to n-type impurities, the process steps are applicable to p-type impurities and vice versa. Also, the present invention is applicable to substrates other than silicon which are known in the art. Moreover, the terms "polysilicon" and "polycrystalline silicon" are used herein interchangeably as in the prior art. Also, when reference is made to impurities of a "first type" and to impurities of the "second type", it is understood that the "first type" refers to n- or p-type impurities and "second type" refers to the opposite conductivity type. That is, if the "first type" is $p$, then the "second type" is $n$. If the "first type" is $n$, then the "second type" is $p$.

The terms "dielectric isolation", "oxide isolation", and "field isolation" are used herein interchangeably as in the prior art. Also, the terms "field doping" and "channel stopper doping" are used interchangeably, and the terms "oxide" and "silicon dioxide" are used interchangeably.

Figure 4A:
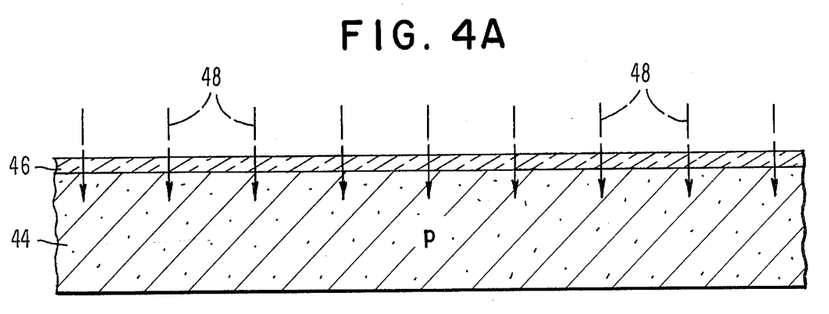
FIGS. 4A-4E shows the method of fabrication for the oxide isolation structure of the present invention.

Referring to FIG. 4A, there is shown a fragment of the initial structure of the invention. A p-type semiconductive silicon substrate 44 having a desired crystallographic orientation (e.g., <100>) is prepared by slicing and polishing a p-type silicon boule grown in the presence of a p-type dopant such as boron following conventional crystal growth techniques. Other p-type dopants for silicon include aluminum, gallium, and indium. The resistivity of the silicon substrate is approximately 5 to 15 ohm-cm, and is preferably about 10 ohm-cm (i.e., $1.3 \times 10^{15}$ cm$^{-3}$ p-type doping concentration).

The first step in preparing the isolation regions is to grow or deposit a thin layer of silicon dioxide 46 on the silicon substrate 44. This layer 46 is about 300 to 1000 Angstroms in thickness. Preferably layer 46 is about 500 Angstroms thick and preferably is formed by thermal oxidation of the silicon surface at about 900° C for 26 minutes in the presence of steam. Layer 46 serves to protect the silicon surface from contamination and provides a screen oxide layer through which the subsequent boron implant is made. When desired, layer 46 may be omitted from the process.

The boron doping is then performed. Preferably this is accomplished by ion implantation of B$^{11}$ ions 48. Typically the boron implantation energy is about 40 keV and the dosage is approximately $10^{12}$ cm$^{-2}$ when the substrate resistivity is 10 ohm-cm. It is noted that the boron ions 48 penetrate through the oxide layer 46 and reside near the surface of the semiconductive substrate 44 over the entire surface, i.e., in both the future field regions and the future device regions.

Figure 4B:
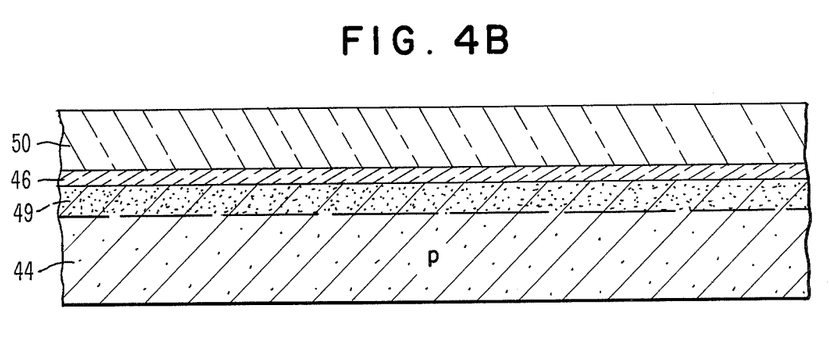

The next step in the process is to form a thick dielectric isolation layer 50. This is done at a low fabrication temperature so that the concentration of boron ions 49 in the substrate is not significantly perturbed by diffusion during the formation of the dielectric isolation layer 50 (see FIG. 4B). Layer 50 is approximately 3000 to 10,000 angstroms thick, and is preferably about 5000 angstroms thick. Preferably layer 50 is formed of silicon dioxide and preferably by chemical vapor deposition at a temperature of 800° C for about 30 minutes. Layer 50 is then densified to improve its etching characteristics and to improve photoresist adhesion by heating in a dry oxygen atmosphere for 5 minutes at 1000° C. The resultant structure is shown in FIG. 4B.

Now the first lithographic pattern delineating step can be performed. The dielectric isolation technique of the present invention can be used with either polysilicon gated or metal gated FETs. For the purposes of illustration, a polysilicon gated FET will be assumed. The first lithographic pattern delineates the device regions 52 and 54 in the oxide layers 50 and 46 (see FIG. 4C).

Figure 4C:
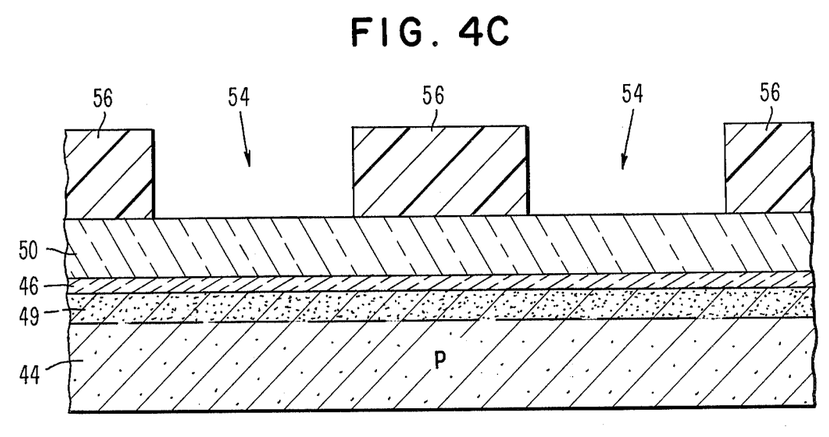

A pattern determining layer such as a layer of resist material 56 of the type employed in known lithographic masking and etching techniques is placed over the surface of the oxide layer 50. Any of the well-known photosensitive polymerizable resist materials known in the art may be used. The resist material is applied as by spinning on or by spraying.

The layer of photoresist material 56 is dried and then selectively exposed to ultraviolet radiation through a photolithographic mask (not shown). This mask is of a transparent material having opaque portions in a predetermined pattern. The masked wafer is subjected to ultraviolet light, polymerizing the portions of the resist material underlying the transparent regions of the mask. After removing the mask, the wafer is rinsed in a suitable developing solution which washes away the portions of the resist material which were under the opaque regions of the mask and thus not exposed to the ultraviolet light. The assembly may then be baked to further polymerize and harden the remaining resist material which conforms to the desired predetermined pattern, i.e., it covers the regions in which the isolation regions will subsequently be formed. This is the first lithographic masking step of the process. The resultant structure is shown in FIG. 4C.

Figure 4D:
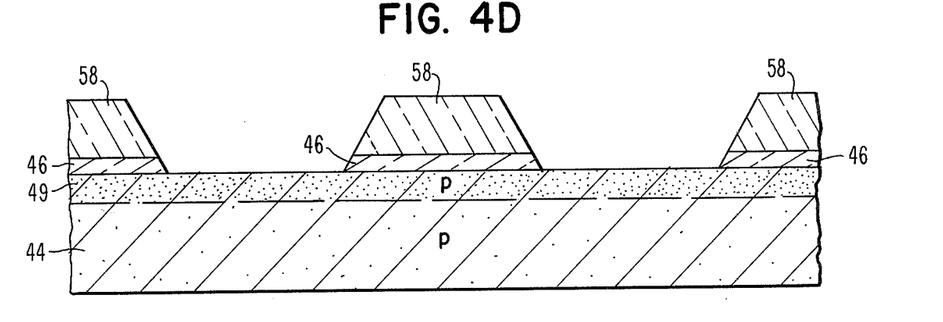

Next the structure is treated to remove the portions of silicon dioxide layers 50 and 46 not protected by the resist material 56. The wafer is immersed in a solution of buffered hydrofluoric acid. The etching solution dissolves silicon dioxide but does not attack the resist or silicon. The photoresist material 56 above the etched isolation regions 58 of silicon dioxide is then removed by dissolving in a suitable solvent. The remaining silicon dioxide field isolation regions 58 conform to a predetermined pattern. The resultant structure is shown in FIG. 4D.

Figure 4E:
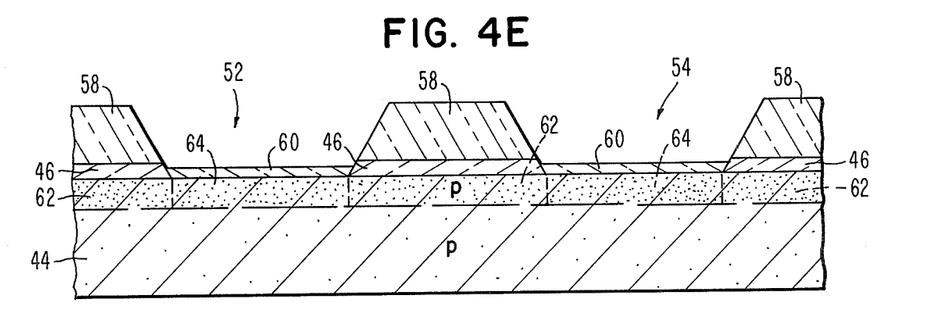

Now the FET gate insulator layer 60 about 300 to 1000 Angstroms thick is formed (see FIG. 4E). Preferably layer 60 is of silicon dioxide and preferably is about 500 Angstroms thick. Layer 60 is formed in device regions 52 and 54 preferably by thermal oxidation of the silicon surface in the presence of dry oxygen and HCl vapor at 1000° C for about 29 minutes. During growth of the thin gate insulator of silicon dioxide, some boron doping atoms in the FET device regions 52 and 54 are depleted from the semiconductive substrate. Boron atoms are not significantly depleted however from doped channel stopper regions 62 which are covered with a thick layer of isolation oxide 58. Thus the boron doping concentration 64 in the device regions 52 and 54 will be advantageously less than that in the field regions 62. This will insure that, along the sides of the FET channel region, conduction will preferably occur under the thin oxide 60 and not under the thick oxide 58 at or near the boundary of the two regions. The boron doping 64 will serve as the channel doping to raise the threshold of subsequently formed FETs in device regions 52 and 54. The boron doping 62 will serve to prevent parasitic conductive channels from forming under thick oxide isolation 58 which could disadvantageously cause electrical shorting or leakage currents between FETs in regions 52 and 54.

Figure 5:
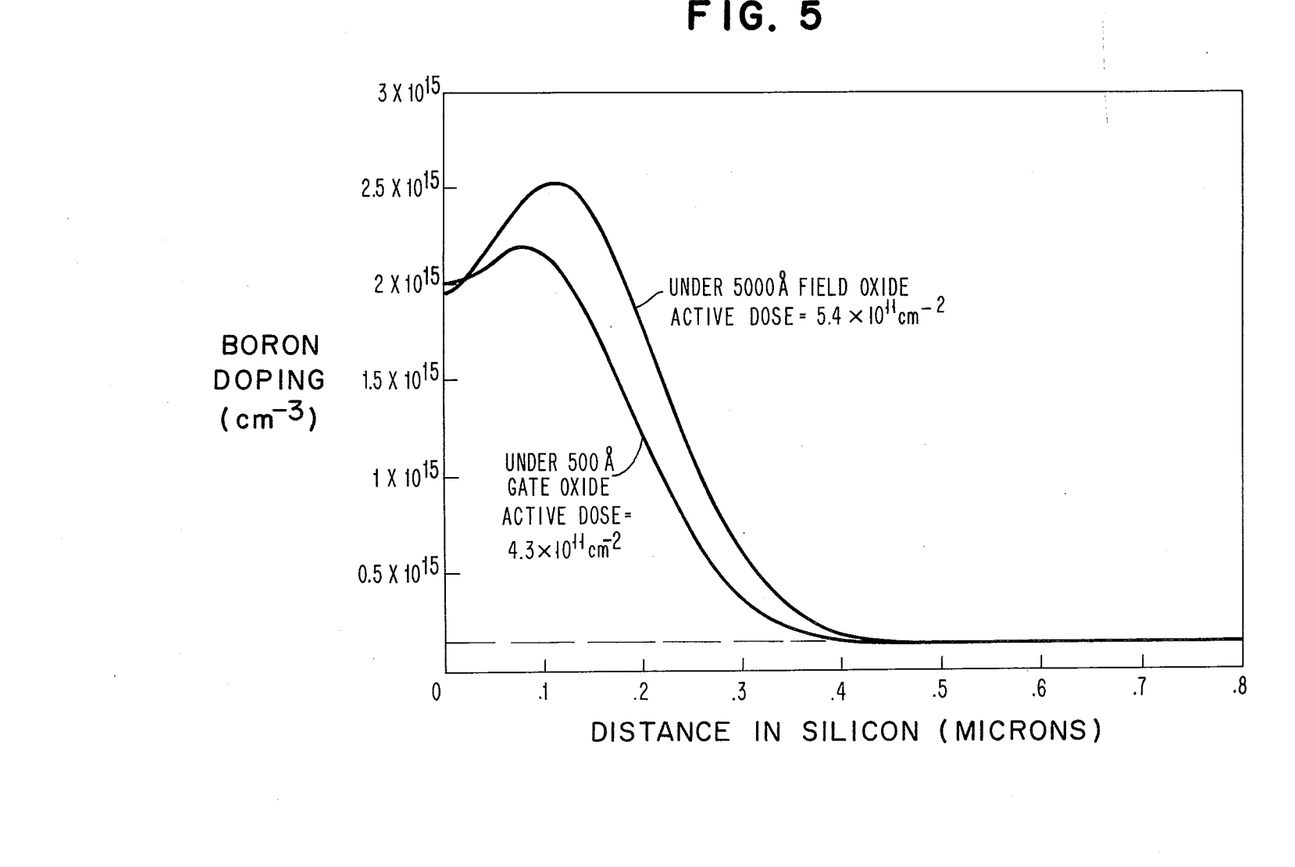
FIG. 5 shows the predicted boron doping profiles under the thick field oxide and thin channel oxide regions.

FIG. 5 shows the boron doping profiles under the thick field oxide and under the thin gate insulator as predicted by a numerical computer model of Morehead, "A General Calculation of the Redistribution of Ion Implanted Profiles in MOS and other Processing", ECS Fall Meeting Extended Abstracts, Oct. 13-17, 1974, New York, pp. 474-475. It is noted from FIG. 5 that the total channel stopper during concentration under the thick field oxide (active dose = $5.4 \times 10^{11} cm^{-2}$) exceeds that of the FET channel region under the thin gate oxide (active dose = $4.3 \times 10^{11} cm^{-2}$). The boron doping in the field region must equal or exceed that of the channel region at the boundary between the field and channel regions in order to prevent parasitic side wall conduction under the field oxide. This effect has been described by Dennard, Walker and Rideout in the aforementioned U.S. Patent.

It is also noted from FIG. 5 that the boron field and channel doping profiles are high near the silicon surface. This is particularly important for the channel stopper to properly prevent surface inversion from occurring. Rather than forming the thick field oxide by a low temperature chemical vapor deposition, if one were to form it by a higher temperature thermal oxidation, the implanted boron profile would be significantly reduced, especially at the silicon surface, due to extensive boron depletion and diffusion. If one were to attempt to implant boron through an already formed thick field oxide, the required high implantation energy would lead to significant spreading of the implanted dose, and a critical loss of doping control.

Figure 6:
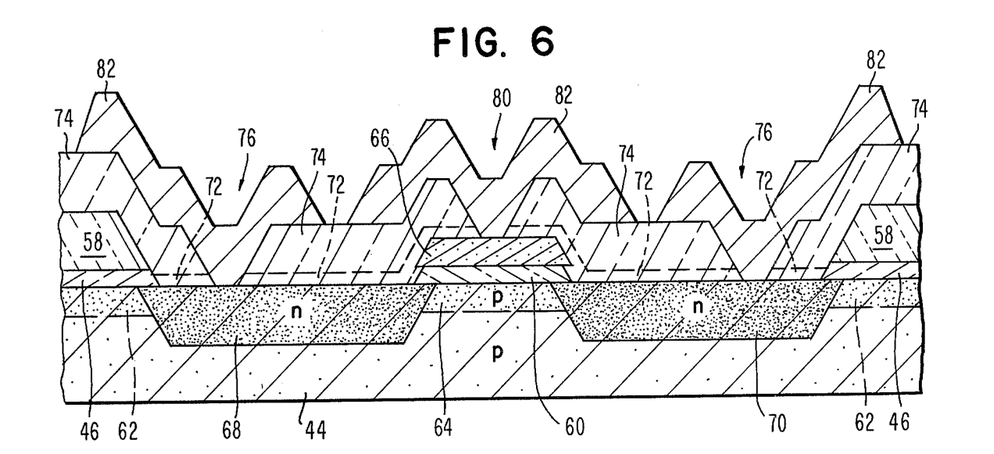
FIG. 6 shows a cross sectional view of a FET utilizing the oxide isolation structure of the method of the present invention.

From this point on the process may proceed in a conventional fashion as known in the prior art. A representative example of a polysilicon gate FET fabricated with the isolation method of the present invention is shown in FIG. 6. For example, a polysilicon layer may be deposited, doped n-type, and a silicon dioxide layer for delineating the polysilicon regions formed by thermal oxidation or chemical vapor deposition. Then polysilicon FET gate electrode areas 66 are delineated using the second resist masking pattern. The n-type source and drain regions 68 and 70 are then formed by well known ion implantation or diffusion techniques. For purposes of illustrating the method of the present invention, diffusion has been selected. Portions of thin silicon dioxide layer 60 not covered by polysilicon regions 66 are removed by etching in a buffered hydrofluoric solution. Then a thin layer of POCl$_3$ is deposited over the entire structure, and source and drain regions 68 and 70 about 10,000 Angstroms deep are formed by diffusion during subsequent heat treatments. The first heat treatment is a thermal oxidation in steam at 1000° C to grow about 1000 Angstroms of silicon dioxide 72 over the source, drain and gate regions. Then a thicker silicon dioxide layer 74 about 3000 Angstroms thick is chemically vapor deposited on the structure. A thin layer of about 300 Angstroms of phosphosilicate glass (not shown) is deposited and driven into the deposited oxide layer 74 at 1000° C to prevent ionic contamination of the silicon surface. A third resist layer (not shown) is deposited and delineated to provide contact holes 76, 78, and 80 to the n-type source, drain and polysilicon gate regions, respectively. Then a metal layer such as aluminum 10,000 Angstroms thick is deposited, and a resist layer (not shown) deposited and delineated to provide a metallic interconnection pattern 82.

Figure 7:
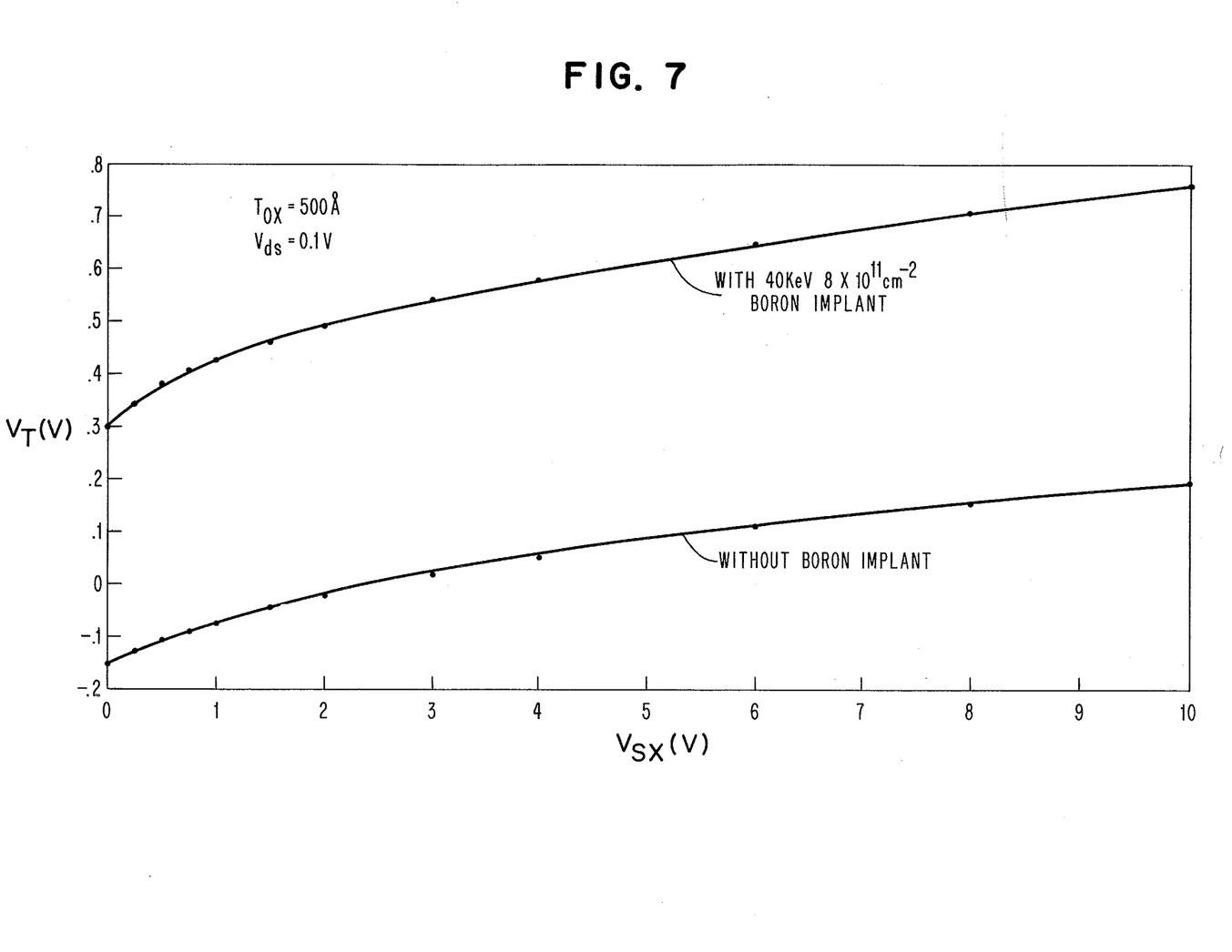
FIG. 7 shows the experimental threshold voltage versus substrate bias relationship of a thin oxide enhancement-mode FET using the isolation method of the present invention.
Figure 8:
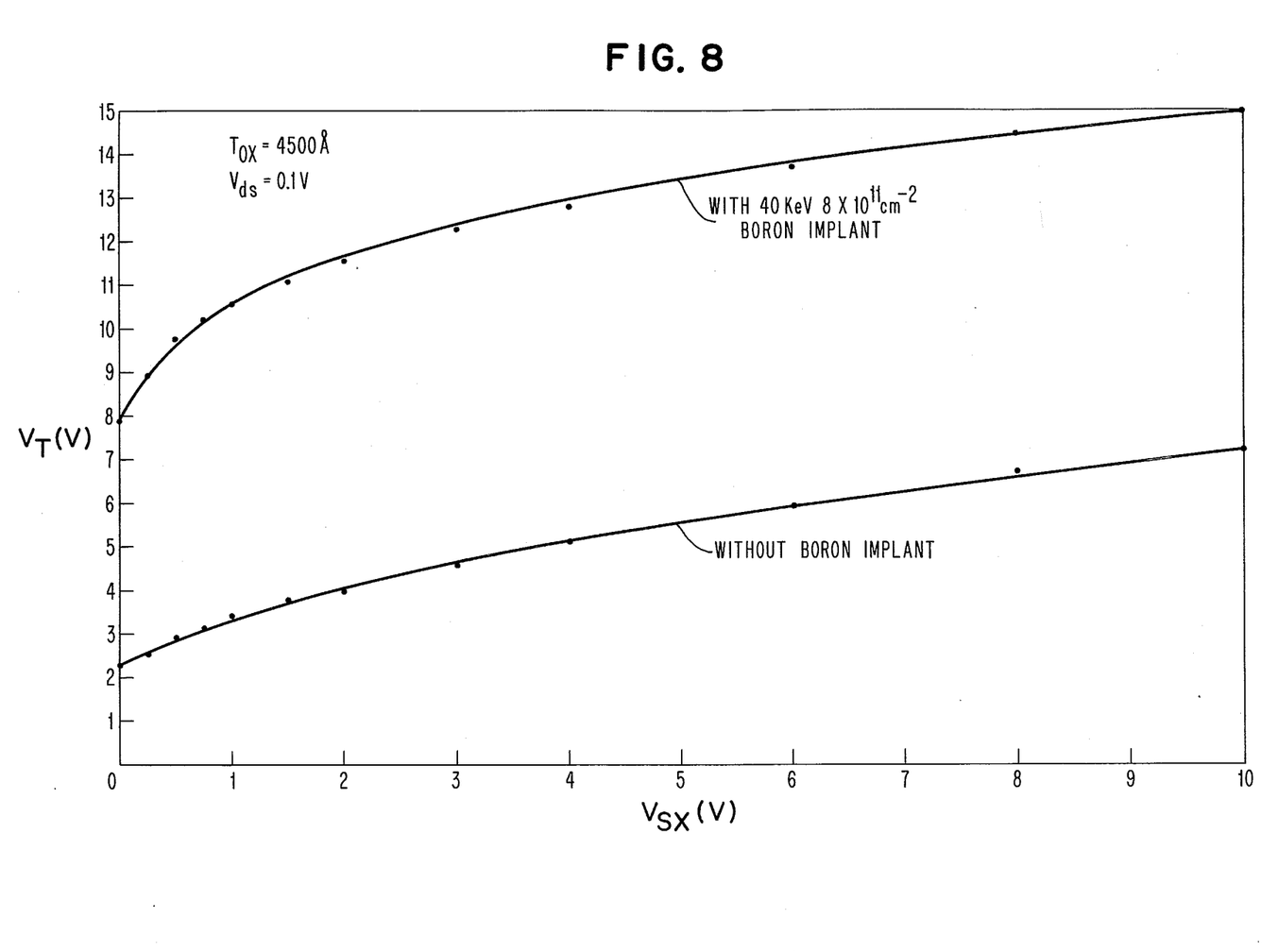
FIG. 8 shows the experimental threshold voltage versus substrate bias relationship of the parasitic thick oxide FET of the method of the present invention.

In the method of the present invention, a single boron implantation is used to provide both the channel stopper field doping 62 and the FET channel doping 64 as shown in FIG. 6. The gate threshold voltage of the thin oxide FET must be increased to an acceptable value, typically about 0.5 Volts for a given source to substrate bias condition of typically about 2.0 Volts. The parasitic threshold voltage of the field oxide must be as large as possible for the same substrate bias condition, preferably larger than about 10 Volts. FIG. 7 shows the experimental threshold voltage, $V_T$, versus source to substrate bias, $V_{SX}$, characteristic for a polysilicon gated FET fabricated using the method of the present invention. It is noted that the threshold voltage is about 0.5 Volts for $V_{SX} = 2$ Volts and an oxide thickness of 500 Angstroms. FIG. 8 shows the experimental threshold voltage, $V_T$, for a parasitic polysilicon gated FET formed over the thick field oxide again versus the source to substrate bias, $V_{SX}$. It is noted that the threshold voltage of the parasitic device is about 11.5 Volts for $V_{SX} = 2.0$ Volts and a field isolation oxide thickness of 4500 Angstroms. The threshold voltages of both the thin and thick oxide FETs may be raised by increasing the boron implantation dose which is $8 \times 10^{11} cm^{-2}$ in this example. The threshold of the thick oxide FET alone can be increased by increasing the thickness of the chemically vapor deposited field oxide which is 4500 Angstroms in this example.

Figure 9:
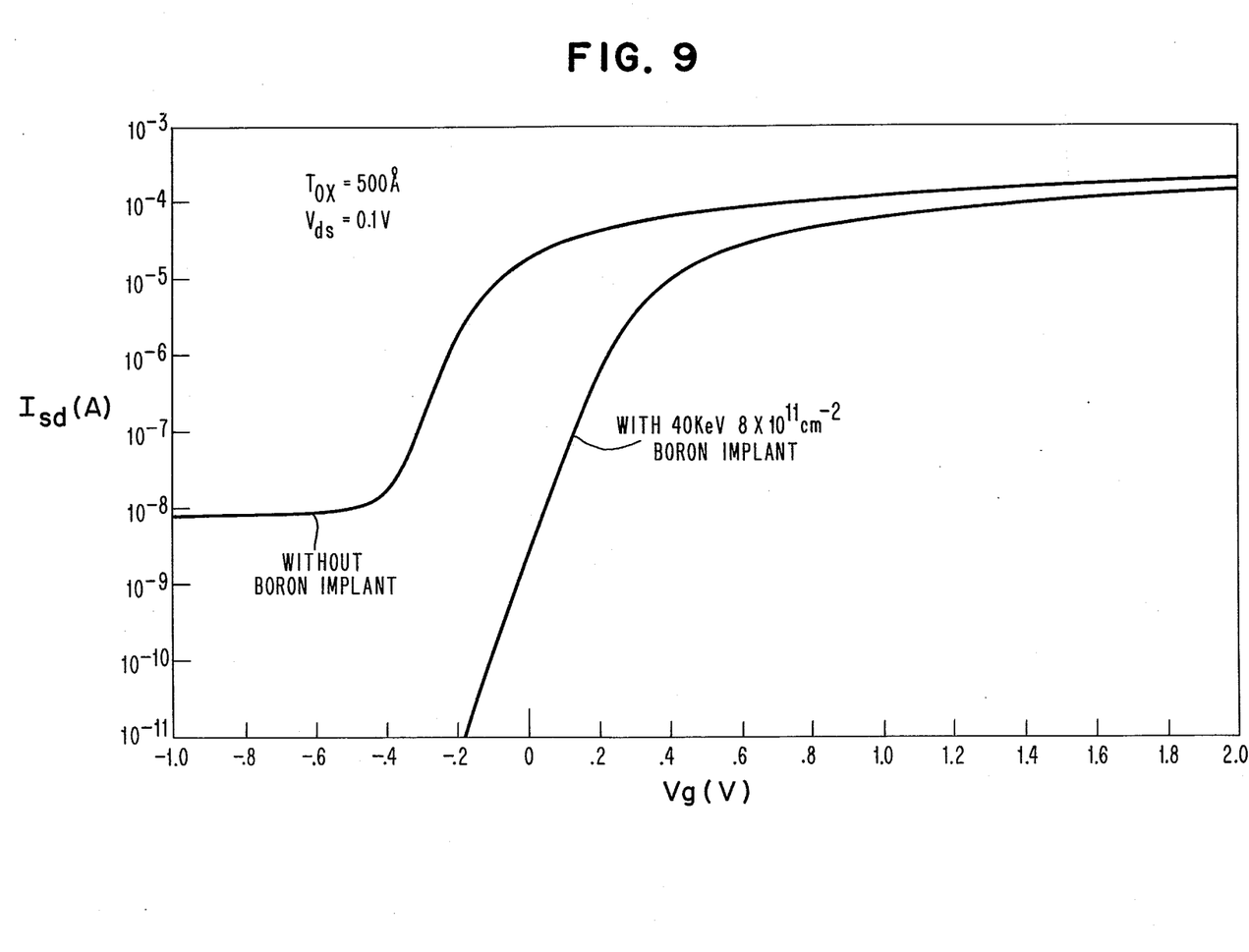
FIG. 9 shows the subthreshold conduction characteristic of an FET using the oxide isolation method of the present invention.

As mentioned previously, the doping conditions at the thin to thick oxide boundary under the polysilicon gate must be such that parasitic sidewall leakage currents are prevented or reduced to an acceptable level. FIG. 9 shows the experimental source to drain subthreshold conduction current, $I_{SD}$, versus gate voltage, $V_g$, characteristic of a thin oxide FET fabricated using the isolation method of the present invention. It is noted that the device with the implanted field and channel regions turns off to leakage currents of less than $10^{-11}$ Amperes which is generally acceptable for integrated circuit operation.

As is known to those skilled in the state of the art, other layers such as a sputtered quartz passivation layer may be provided. Furthermore, additional masking steps may be performed to provide vias through this passivation layer to access the metallic interconnection pattern. In addition, electrical connection to either side of the semiconductive substrate may be provided by additional contact holes and metallic layers. The method of the present invention may be used with n-channel or p-channel FETs, and may also be applied to provide isolation regions for bipolar transistors or for metal-semiconductor (Schottky barrier) FETs.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of fabricating field effect transistors having a common channel stopper and FET channel doping with the channel stopper doping self-aligned with respect to the field dielectric isolation regions between transistors comprising the steps of
   (A) increasing the impurity concentration of a semiconductive substrate of first conductivity type near its surface by the step of doping by ion implantation or diffusion of impurities of a first conductivity type,
   (B) then depositing a field dielectric isolation layer on said surface of the semiconductive substrate,
   (C) then delineating predetermined regions to provide field dielectric isolation regions,
   (D) forming an FET gate insulator layer over regions of the substrate not covered by field dielectric isolation regions,
   (E) then forming a layer of electrically conductive material on the structure,
   (F) delineating predetermined regions in the conductive material to provide FET gate electrodes,
   (G) forming doped FET source and drain regions of a second and opposite conductivity type,
   (H) forming an insulating layer over the structure,
   (I) delineating predetermined contact hole regions to provide vias through the insulating layer to source, drain and gate of the FET,
   (J) forming a metal layer on the structure, and
   (K) delineating a predetermined metallic interconnection pattern in the metal layer.

2. A method of fabricating field effect transistors according to claim 1 wherein said semiconductive substrate is p-type silicon containing boron, aluminum, gallium, or indium impurities.

3. A method of fabricating field effect transistors according to claim 2 wherein the increased impurity concentration near the substrate surface in step (A) is p-type and is doped with boron, aluminum, gallium, or indium acceptor.

4. A method of fabricating field effect transistors according to claim 1 wherein doping step (A) is preceded by the step of forming a thin layer of silicon dioxide on the silicon substrate surface by thermal oxidation or by chemical vapor deposition.

5. A method of fabricating field effect transistors according to claim 4 wherein said field dielectric isolation layer of step (B) is formed of silicon dioxide by chemical vapor deposition.

6. A method of fabricating field effect transistors according to claim 1 wherein said delineating in steps (C), (F), (I), and (K) includes forming a layer of resist material on the structure, selectively exposing the resist material to radiation, rinsing away the unexposed portions of the resist material, etching the underlying layer, and dissolving remaining portions of the resist material.

7. A method of fabricating field effect transistors according to claim 3 wherein step (D) of forming an FET gate insulator includes forming a layer of silicon dioxide about 300 to 1000 Angstroms thick by thermal oxidation of the silicon surface in the presence of oxygen.

8. A method of fabricating field effect transistors according to claim 1 wherein said electrically conductive material of step (E) is of doped polycrystalline silicon which is chemically vapor deposited on the structure.

9. A method of fabricating field effect transistors according to claim 3 wherein said doped FET source and drain regions of step (G) are n-type and are formed by diffusion or ion implantation of phosphorus, arsenic, or antimony.

10. A method of fabricating field effect transistors according to claim 1 wherein said insulating layer of step (H) is of silicon dioxide and is formed by thermal oxidation and/or chemical vapor deposition.

11. A method of fabricating field effect transistors according to claim 1 wherein said metal layer of steps (J) and (K) is of aluminum and is deposited by evaporation.

12. A method of fabricating field effect transistors according to claim 1 wherein step (A) of increasing the doping concentration near the semiconductive substrate surface provides both the channel stopper doping under the field dielectric isolation regions and the FET channel doping under the gate insulator of subsequently formed field effect transistors.

13. A method of fabricating field effect transistors according to claim 7 wherein the total channel stopper doping concentration under the field dielectric isolation region equals or exceeds that under the FET gate insulator as a result of depletion of p-type impurities from the substrate during the thermal oxidation of step (D).

14. A method of fabricating field effect transistors according to claim 1 wherein at least two interconnected transistors are fabricated to form an integrated circuit.

* * * * *